017;# United States Patent [19]

Inoue et al.

[11] 4,384,229
[45] May 17, 1983

[54] TEMPERATURE COMPENSATED PIEZOELECTRIC CERAMIC RESONATOR UNIT

[75] Inventors: Takeshi Inoue; Sadayuki Takahashi, both of Tokyo, Japan

[73] Assignee: Nippon Electric Co., Ltd., Tokyo, Japan

[21] Appl. No.: 233,141

[22] Filed: Feb. 10, 1981

[30] Foreign Application Priority Data

Feb. 14, 1980 [JP] Japan .................................. 55-16847
Mar. 6, 1980 [JP] Japan .................................. 55-28506
Mar. 6, 1980 [JP] Japan .................................. 55-28507

[51] Int. Cl.³ ............................................ H01L 41/08
[52] U.S. Cl. ...................................... 310/315; 310/358; 310/320
[58] Field of Search ............... 310/311, 314, 315, 318, 310/319, 320, 357–359; 333/186–192; 331/65, 66, 73, 158–164, 176, 116 R; 318/119–134; 368/156

[56] References Cited

U.S. PATENT DOCUMENTS

| 2,157,665 | 5/1939 | Hollmann | 310/315 |
| 2,940,035 | 6/1960 | Lefkowitz | 310/320 X |
| 3,185,869 | 5/1965 | Shoor | 310/315 |
| 3,404,298 | 10/1968 | Roberts | 310/315 |
| 3,641,461 | 2/1972 | Mrozek | 331/176 X |
| 3,659,123 | 4/1972 | Oya | 310/358 X |
| 3,676,724 | 7/1972 | Berlincourt et al. | 310/358 X |
| 4,100,512 | 7/1978 | Valdois | 331/158 |

FOREIGN PATENT DOCUMENTS 55-110416 8/1980 Japan .................................. 331/176

OTHER PUBLICATIONS

"Useful Formula for Piezoelectric Ceramic Resonators and Their Application to Measurement of Parameters", by M. Onoe et al.
The Journal of the Acoustical Society of America, vol. 41, No. 4, Part 2, 1967, pp. 974–980.

*Primary Examiner*—Mark O. Budd
*Attorney, Agent, or Firm*—Blakely, Sokoloff, Taylor & Zafman

[57] ABSTRACT

A thickness mode piezoelectric ceramic resonator is connected in series with a ceramic capacitor to form a piezoelectric ceramic resonator unit. When the ceramic capacitor has a capacitance Ca and the resonator is associated with a damped capacitor having a capacitance Co, these capacitances are related to each other by a relationship, $Co \leq Ca \leq 30\ Co$.

7 Claims, 15 Drawing Figures

TEMPERATURE COMPENSATED PIEZOELECTRIC CERAMIC RESONATOR UNIT

BACKGROUND OF THE INVENTION

The present invention generally relates to a piezoelectric ceramic resonator performing thickness resonant mode vibrations accruing from thickness shear and thickness extension.

Generally, in a relatively high frequency range of 1 MHz or more, resonators are operated in thickness resonant mode mainly accruing from thickness shear and thickness extension. The reason is that if a contour extensional mode accruing from the extensional vibration of a disk is used, dimensions of the resonator becomes too small to machine and support it.

Especially, it is known that a satisfactory resonant response without spurious signals around the resonance frequency can be obtained by the thickness resonant mode resonator, so-called trapped energy resonator. The resonance frequency of the thickness mode resonator is, however, determined substantially by the thickness of the piezoelectric ceramic sheet or base plate. Since the resonance frequency is an inverse proportion to the thickness of the sheet, it is difficult to adjust the resonance frequency once the thickness of the sheet is determined after mounting the electrodes, and this is a common drawback of this type of resonators.

However, the adjustment of frequency is not absolutely impossible, but a method is known in which the frequency is controlled by precisely increasing the thickness of the electrode in a vapor deposition apparatus as in the case of manufacturing some kind of crystal vibrators. However, this method is unsuitable for mass production, causing high manufacturing cost and thus limitation of use.

In manufacturing thickness resonant mode piezoelectric ceramic resonators in the past, it could not be expected to adjust the frequency after deposition of the electrodes because of the cost problem as mentioned above. Therefore, the resonance frequency of piezoelectric ceramic chips was measured before mounting the electrodes to select a chip having a resonance frequency within a predetermined range without the electrodes. Then, a number of piezoelectric ceramic resonators were produced from the thus selected chip by providing the electrodes.

In this case, the resonance frequency of each resonator is irregular due to the difference of the sound velocity at different locations in the piezoelectric ceramic chip and the irregularity in the thickness of the chip, in size of deposited electrodes, and in thickness of deposited electrodes. Accordingly, it was quite difficult to manufacture piezoelectric resonators with resonance frequency irregularity less than 0.5%.

Therefore, in manufacturing narrow-band filters having a fractional band width of 1% or less, the frequency must be adjusted at least as accurate as 0.1%, and very poor yield rate results when fabricating narrow-band filters by merely using piezoelectric ceramic resonators produced in the conventional manufacturing processes as described above.

Therefore, in order to realize a narrow-band filter by use of a thickness resonant mode piezoelectric ceramic resonator, the frequency must somehow be adjusted.

However, it is difficult to adjust the frequency of the thickness resonant mode resonator per se as mentioned above.

On the other hand, it is known that by connecting a reactive element such as an inductor or a capacitor in series with a piezoelectric resonator, the resonance frequency of a piezoelectric resonator unit consisting of the piezoelectric resonator and the reactive element can be varied. For the reactive element, a capacitor is more preferable than an inductor, since the latter has large dimensions and a small Q-value.

However, the performance of a thickness resonant mode piezoelectric ceramic resonator cannot be enhanced by merely connecting a capacitor to it at random.

In order to materialize a practically valuable and high-quality and highly reliable thickness resonant mode piezoelectric ceramic resonator unit, the following points must be taken into consideration:

(1) The resonance frequency fr is easy to adjust;

(2) The resonant response is sharp within the range of adjustment of the resonance frequency;

(3) Piezoelectric ceramic is advantageously a high electro-mechanical coupling factor material. However, it also has a disadvantage that it is very difficult to obtain compatibility between temperature characteristics and aging characteristics for the resonance frequency. That is to say, it is very difficult to find a piezoelectric ceramic material having a nearly zero temperature coefficient for the resonance frequency and also satisfactory aging characteristics for the resonance frequency. If the resonator has a poor stability in these characteristics, it is impossible to fabricate a highly reliable resonator unit or filter using resonator units. Accordingly, it is necessary to obtain excellent temperature and aging characteristics for the resonance frequency of the unit; and (4) There has been widely used for the circuit arrangement of a piezoelectric ceramic filter a ladder type circuit and a Jaumann type circuit. It is known that when the mechanical quality factor Qm of the piezoelectric ceramic resonator incorporated in such a circuit varies, the filter insertion loss also varies depending on it. Typically, the piezoelectric ceramic resonator used for the piezoelectric ceramic resonator unit or filter has a mechanical quality factor Qm of 300 to 2000. Piezoelectric ceramic resonators with a small temperature dependent Qm within the temperature range from $-20°$ C. to 60° C. can easily be obtained when the material has a Qm of 500 or less, whereas it is difficult to obtain such resonators if Qm is larger than 500. However, when a narrow-band filter having a fractional band width of 1% or less and using an piezoelectric ceramic material having a Qm of 500 or less, the filter insertion loss tends to increase, and it is difficult to obtain a filter having satisfactory characteristics. It is also difficult to obtain a filter having sharp frequency selectivity characteristics. Therefore, in order to make a narrow-band filter or a filter having sharp frequency selectivity characteristics, it is necessary to use a piezoelectric ceramic resonator having a Qm of 500 or more. However, when a filter is constructed using a piezoelectric resonator having a Qm of 500 or more, the value of Qm depends too much on the temperature and thus the filter insertion loss also depends too much on the temperature. Therefore, the magnitude of the output signal from such filters varies disadvantageously depending on the temperature. For the reasons set forth above, there is a need of suppressing variations of Qm with temperature.

SUMMARY OF THE INVENTION

An object of the present invention is to provide an improved piezoelectric ceramic resonator unit which can assure easy adjustment of resonance frequency and compensate for temperature characteristics of the resonance frequency.

Another object of the invention is to provide a piezoelectric ceramic resonator unit having improved mechanical quality factor and aging characteristics of the resonance frequency.

Still another object of the invention is to provide a band-pass filter using the improved piezoelectric ceramic resonator units.

Broadly, according to the invention, there is provided a piezoelectric ceramic resonator unit comprising a thickness mode piezoelectric ceramic resonator and a ceramic capacitor connected in series with the resonator, wherein a capacitance Ca of the ceramic capacitor and a damped capacitance Co of the resonator have a relationship of:

$$Co \leq Ca \leq 30\ Co$$

Thus, the resonance frequency can be adjusted precisely by choosing the value of Ca appropriately, and a resonator unit having a desired resonance frequency can easily be obtained.

Moreover, the temperature and aging characteristics for the resonance frequency can be improved within the range of the above relationship by choosing a ceramic capacitor having a temperature coefficient different from that of the damped capacitance Co.

DESCRIPTION OF THE PREFERRED EMBODIMENTS

Figure 1A:
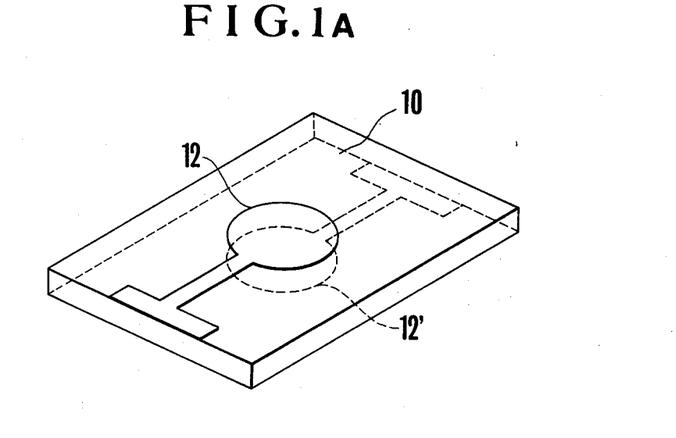
FIG. 1A is a perspective view of a piezoelectric ceramic resonator based on the thickness extentional mode.
Figure 1B:
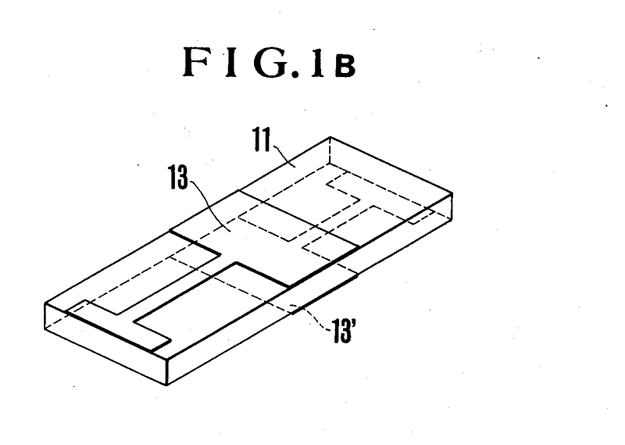
FIG. 1B is a perspective view of a piezoelectric ceramic resonator based on the thickness shear mode.

Referring now to FIGS. 1A and 1B, there are exemplified piezoelectric ceramic resonators operable in the thickness resonant mode. A piezoelectric ceramic resonator as shown in FIG. 1A utilizes the thickness extensional vibration, where partial electrodes 12 and 12' confronting each other are provided in the center of the front and back surfaces of a piezoelectric ceramic sheet 10. A piezoelectric ceramic resonator as shown in FIG. 1B utilizes thickness shear vibration, where a piezoelectric ceramic sheet 11 has been polarized beforehand in the direction of length and partial electrodes 13 and 13' confronting each other are provided in the center of the front and back surfaces of the piezoelectric ceramic sheet 11. Since vibration energy is trapped within the piezoelectric sheet between the partial electrodes 12 and 12', or between 13 and 13', these thickness resonant mode resonators are called trapped energy resonator.

Figure 2:
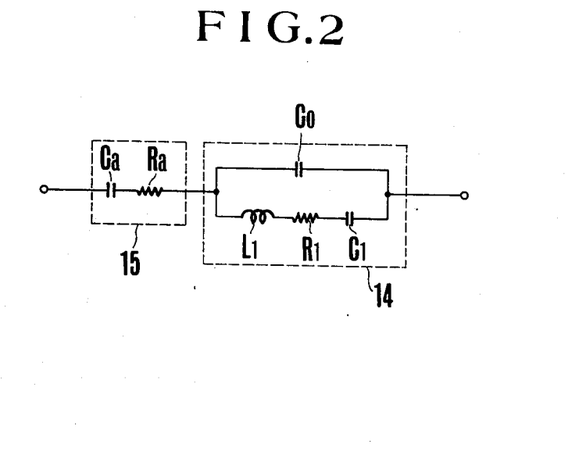
FIG. 2 is a circuit diagram showing an equivalent circuit of a piezoelectric ceramic resonator unit embodying the invention.

As generally known, a piezoelectric ceramic resonator can be expressed in the vicinity of its resonance frequency by an equivalent circuit consisting of damped capacitor Co, an equivalent dynamic inductor L1, an equivalent dynamic capacitor C1, and an equivalent resonant resistor R1, as shown at a dotted line block 14 in FIG. 2. It is noted that electrical elements are hereinafter denoted by the same reference symbols as their values. The resonator has a resonance frequency frp and an antiresonance frequency fap as shown with the solid line in FIG. 3.

It is generally known that the resonance frequency of a piezoelectric ceramic resonator can be varied when a capacitor is connected in series with the resonator, the serial capacitor being expressed by an equivalent circuit including a capacitance Ca and an equivalent resistance Ra representative of dielectric loss as shown at a dotted line block 15 in FIG. 2.

Here, a combination of a piezoelectric ceramic resonator and a capacitor connected thereto in series is called a piezoelectric ceramic resonator unit. Let a ratio of the capacitance Ca of the serially connected capacitor to the damped capacitance Co of the piezoelectric ceramic resonator be a, i.e. Ca/Co=a, the resonance frequency fr of the piezoelectric ceramic resonator unit can be given by the following equation:

$$f^2r = (a\, frp^2 + fap^2)/(1+a) \tag{1}$$

Figure 3:
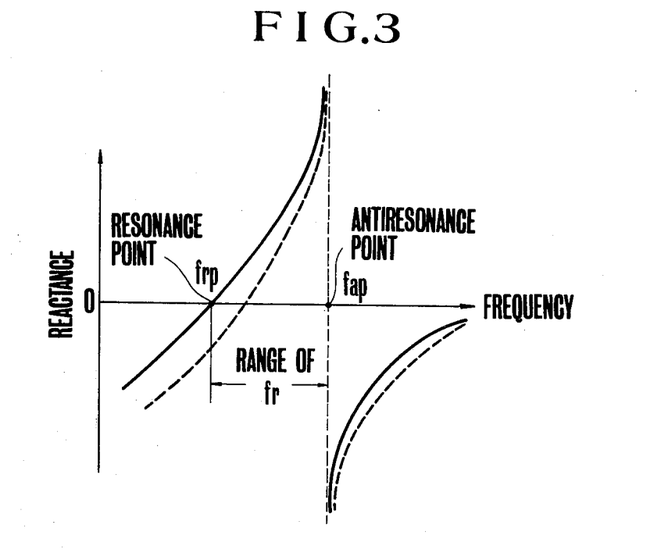
FIG. 3 is a graph showing, with the solid line curves, the reactance characteristics of the piezoelectric ceramic resonator and, with dotted line curves, the reactance characteristics of the piezoelectric ceramic resonator unit.

Accordingly, by connecting an external additional capacitor having a capacitance Ca in series to the piezoelectric ceramic resonator, the resonancce frequency fr of the piezeoelectric ceramic resonator unit can be shifted to the middle of frp and fap, as shown at dotted line curves in FIG. 3. In this case, the smaller the capacitance ratio of the piezoelectric ceramic resonator is, the wider the distance between frp and fap becomes, and thus the wider variable range of fr can be accomplished.

By the way, the resonance frequency frp and the antiresonance frequency fap vary in response to the variation of the temperature. Putting a suffix R to the frequencies and capacitance ratio for the room temperature as $fr_R$, $fap_R$, $frp_R$, and $a_R$, equation (1) is rewritten as:

$$fr_R^2 = (a_R frp_R^2 + fap_R^2)/(1+a_R) \tag{2}$$

Similarly, putting a suffix T to the frequencies and capacitance ratio as $fr_T$, $fap_T$, $frp_R$, and $a_T$ for temperature of T°C., equation (1) is rewritten as:

$$fr_T^2 = (a_T frp_T^2 + fap_T^2)/(1+a_T) \tag{3}$$

It can be seen from equations (2) and (3) that the resonance frequency of the piezoelectric ceramic resonator unit does not vary depending on the temperature variation when condition $fr_R = fr_T$ is met, and this condition can be met by determining the temperature coefficient of the capacitor Ca appropriately.

That is, variations of the resonance frequency frp and the antiresonance frequency fap of the piezoelectric ceramic resonator due to the temperature variation can be compensated by use of an external additional capacitor having a capacitance Ca with a temperature coefficient different from that of the damped capacitance Co of the piezoelectric ceramic resonator.

However, it is not possible to realize a high performance piezoelectric ceramic resonator unit by merely connecting a random capacitor in series to the piezoelectric ceramic resonator.

The damped capacitance Co of the piezoelectric ceramic resonator has a positive temperature coefficient in the range of 1000 to 4000 ppm/°C., and the temperature coefficient of the resonance frequency frp can easily be reduced to ±30 ppm/°C. for a PZT family piezoelectric ceramic and to −100 ppm/°C. for a lead titanate family piezoelectric ceramic.

Accordingly, it can be seen from equations (2) and (3) that the temperature coefficient of the capacitor Ca connected in series to the piezoelectric ceramic resonator must be selected within the range from −7000 to 5000 ppm/°C. so as to minimize the temperature dependent variation of the resonance frequency of the piezoelectric ceramic resonator unit.

Fortunately, ceramic capacitors are available as the capacitor having a wide-range temperature coefficient, small dielectric loss tangent (tan δ) and superior aging characteristic, and also at low cost.

A ceramic capacitor can be expressed, as mentioned, by the equivalent circuit which is a serial connection of the equivalent resistor Ra and the capacitor Ca, where $$Ra = \tan\delta/\omega Ca \tag{4}$$

A ceramic capacitor has a tan δ between 0.003 to 0.022, which is determined for a given equivalent resonant resistance R1 of the piezoelectric ceramic resonator by the following equation:

$$Ra/R1 = (Qm \tan\delta/\gamma_p)(1/a) \tag{5}$$

where Qm is the mechanical quality factor of the piezoelectric ceramic resonator having a value from the order of 100 to the order of 1000% and $\gamma_p$ is called the capacitance ratio of the piezoelectric ceramic resonator and expressed as $\gamma_p = Co/C1$. Equation (5) shows that the value of Ra increases relative to R1 as the value of a decreases, and a dull resonant response cannot be avoided. In order to improve the resonant response, use of a ceramic capacitor having small tan δ can be considered. However, a ceramic capacitor has a tan δ of at least 0.003, and it is difficult to obtain the piezoelectric ceramic resonator unit having a sharp resonant response for the value of a smaller than 1.

When equation (1) is partially differentiated with respect to a, it becomes:

$$\frac{\partial fr^2}{\partial a} = (frp^2/\gamma_p)[1/(1+a)^2] \tag{6}$$

Figure 4:
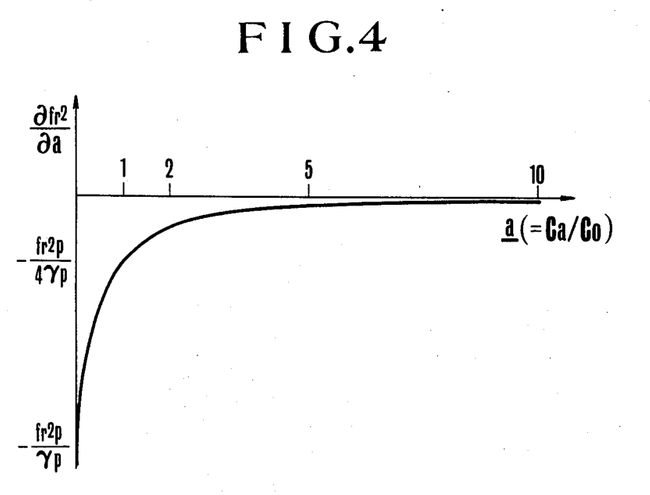
FIG. 4 is a graph showing the variation of the resonance frequency fr of the piezoelectric ceramic resonator unit relative to the value (the ratio of capacitances) of Ca/Co.

FIG. 4 shows the relationship between $\partial fr^2/\partial a$ and a. As can be seen from this plot, $\partial fr^2/\partial a$ can take only negative values. This means that the resonance frequency fr of the piezoelectric ceramic resonator unit decreases as the capacitance Ca of the ceramic capacitor increases relative to the damped capacitance Co. When a is smaller than 1, $\partial fr^2/\partial a$ becomes a very large negative value. This means a very high sensitivity in adjusting the frequency, and adjustment to a desired frequency is difficult. On the other hand, if Ca is too large relative to Co, the sensitivity in adjusting the resonance frequency becomes very dull, making it difficult to achieve the practical frequency adjustment.

Provided that the resonance frequency and capacitance ratio of the piezoelectric ceramic resonator be frp and $\gamma_p$, respectively, and the resonance frequency of the resonator unit be fr, the normalized frequency adjustment width, (fr−frp)/frp is given by the following equation:

$$(fr - frp)/frp = 1/[2\gamma_p(1+a)] \tag{7}$$

Here, the capacitance ratio $\gamma_p$ of the piezoelectric ceramic resonator is generally 3 or more, and the larger the values of $\gamma_p$ and a, the smaller the frequency adjustment width can be. Assuming the value of a (a=Ca/Co) be 30 and combining it with equation (7), the normalized frequency adjustment width becomes around 0.5% or less for any kind of piezoelectric ceramic resonators. That is, the sensitivity in adjusting the frequency becomes too dull, and an externally attached capacitor having a very large capacitance is required, disabling the practical frequency adjustment to be achieved.

Moreover, if Ca is larger than 30Co, the resonance frequency fr of the piezoelectric ceramic resonator unit becomes too close to the resonance frequency frp of the piezoelectric resonator and the temperature compensation for fr will be difficult practically. Therefore, the capacitance Ca of the ceramic capacitor is preferably in the range:

$$Co \leq Ca \leq 30Co$$

EXAMPLE 1

Figure 5:
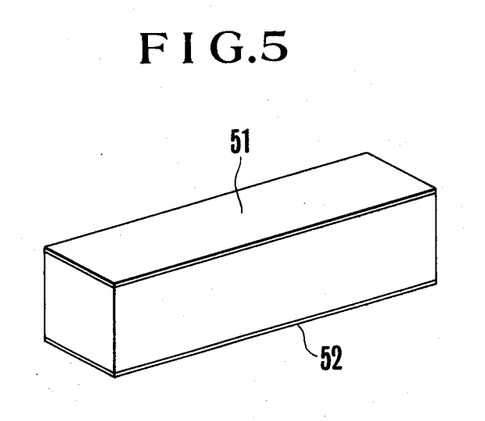
FIG. 5 is a perspective view of the thickness extension mode resonator mode of a lead titanate family piezoelectric ceramic.

A piezoelectric ceramic resonator unit exemplified here consists of a fundamental thickness extensional resonator made of a lead titanate family piezoelectric ceramic and a ceramic capacitor having a temperature coefficient of −5500 ppm/°C. for the dielectric constant and a tan δ of 0.005. The lead titanate family ceramic resonator has a shape of a strip of paper with electrodes 51 and 52 provided thereon as shown in FIG. 5. Since the electro-mechanical coupling factor in the thickness extensional resonance is much larger than that in the contour extensional resonance, relatively satisfactory resonant response can be obtained without use of trapped energy. The resonance frequency frp of the resonator was 2005.64 kHz, the antiresonance frequency fap was 2152.83 kHz, the temperature coefficient of the resonance frequency was −81 ppm/°C., and the temperature coefficient of the antiresonance frequency was −75 ppm/°C. It also showed a satisfactory aging characteristic of 0.05%/decade and a mechanical quality factor Qm of 1200.

Figure 6:
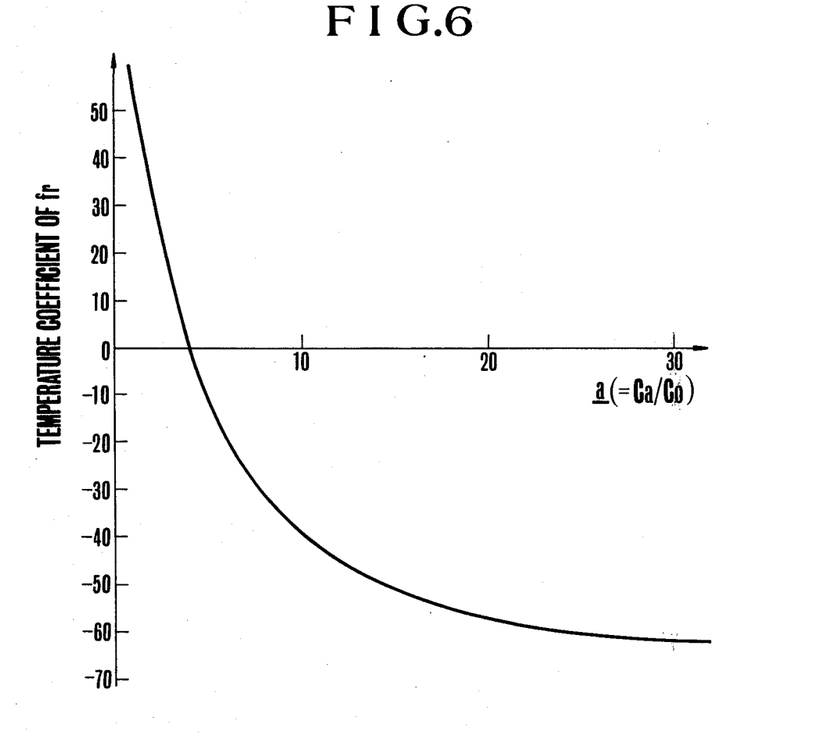
FIG. 6 is a graph showing the temperature coefficient of the resonance frequency of the piezoelectric ceramic resonator unit using lead titanate family piezoelectric ceramic according to the invention.

The aforementioned ceramic capacitor Ca was connected in series to the resonator, and the relationship between the ratio of the capacitance Ca to the damped capacitance Co of the resonator and the temperature coefficient of the resonance frequency was obtained as shown in FIG. 6, where the temperature coefficient of fr is plotted in ppm/°C. From FIG. 6, it can be seen that the temperature coefficient becomes zero at about Ca/Co=4. Subsequently the temperature coefficient of the resonance frequency fr of the piezoelectric ceramic resonator was measured at Ca/Co=4 and in a temperature range from −20° C. to 60° C., as shown in Table 1.

TABLE 1

| Temperature (°C.) | −20 | 0 | 25 | 40 | 60 |
|---|---|---|---|---|---|
| Temp. Coef. of fr (ppm/°C.) | 5.66 | −1.86 | | −4.23 | 4.32 |

It can be seen that the piezoelectric ceramic resonator unit according to the present invention can readily attain the resonance frequency having a temperature coefficient within ±10 ppm/°C., even if a lead titanate family piezoelectric ceramic resonator having unsatisfactory temperature coefficient is used. The temperature coefficient below ±10 ppm/°C. could not at all attained by the conventional lead titanate family fundamental thickness extensional resonator alone.

As can be seen from FIG. 6, in the region of Ca/Co>30 which is outside the range of this invention, the temperature coefficient of fr does not vary even when the value of Ca is changed slightly. Therefore, it is obvious that the temperature compensation of fr in this region is difficult.

EXAMPLE 2

Figure 7:
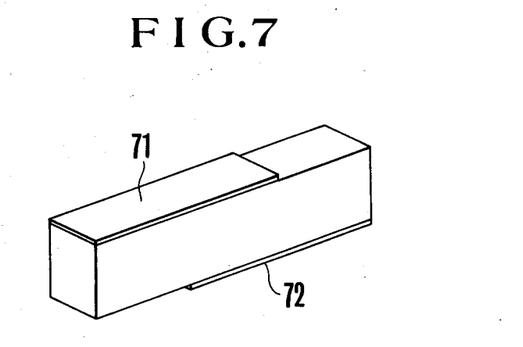
FIG. 7 is a perspective view of a thickness shear mode, trapped energy piezoelectric resonator employing PZT family piezoelectric ceramic, NEPEC-31 (trademark)—Pb[$Zr_{0.414}Ti_{0.496}(Mn_{1/3}Sb_{2/3})_{0.09}$]$O_3$+0.1 wt% NiO+0.1 wt% $SiO_2$, see U.S. Pat. No. 3,699,045.

A piezoelectric ceramic resonator unit exemplified here consists of a thickness shear mode, trapped energy resonator made of a PZT family piezoelectric ceramic, NEPEC-31, and a non-polarized ceramic capacitor, NEPEC-21. The NEPEC-31 thickness shear resonator has been polarized in the direction of length in advance with electrodes 71 and 72 for trapped energy provided on its top and bottom surfaces, as shown in FIG. 7. It had dimensions of 12 mm in length, 0.556 mm in thickness and 0.3 mm in width. Table 2 shows the characteristics of this resonator.

TABLE 2

| Resonance frequency, frp | 1999.34 kHz |
|---|---|
| Antiresonance frequency, fap | 2250.40 kHz |
| Damped capacitance, Co | 13.2pF |
| Mechanical quality factor, Qm | 1500 |
| Temp. Coef. of frp | 31 ppm/°C. |
| Temp. Coef. of fap | 15 ppm/°C. |
| Aging characteristic of frap | 0.03%/decade |

Figure 8:
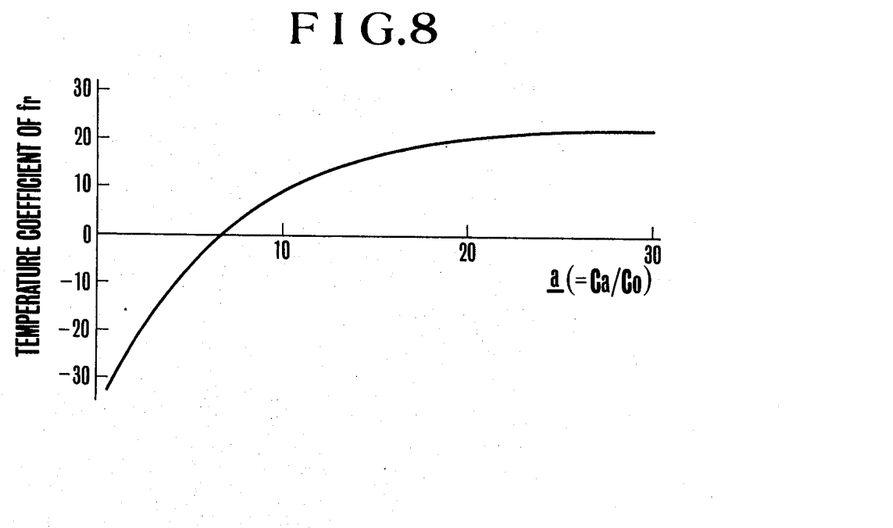
FIG. 8 is a graph showing the temperature coefficient of the resonance frequency of the piezoelectric resonator unit employing PZT family piezoelectric ceramic, NEPEC-31 according to the present invention.

From Table 2, it can be seen that this resonator has the excellent aging characteristic for the resonance frequency frp, whereas it has a slightly large temperature coefficient of 31 ppm/°C. for the resonance frequency frp. An NEPEC-21 non-polarized ceramic capacitor with the dielectric constant having a temperature coefficient of 3500 ppm/°C. (tan δ=0.02) was connected in series to the thickness shear resonator and the ratio of the non-polarized ceramic capacitance Ca of NEPEC-21 to the damped capacitance Co of the NEPEC-31 thickness shear resonator and the temperature coefficient (ppm/°C.) of the resonance frequency fr of the piezoelectric ceramic resonator unit were obtained as shown in FIG. 8. From FIG. 8 it can be seen that the temperature coefficient of fr becomes zero at the value of Ca/Co between 6 and 7. Subsequently, the temperature characteristic of the resonance frequency fr of the piezoelectric ceramic resonator unit was measured at Ca/Co=6.5 and in the temperature range from −20° C. to 60° C. The results are shown in Table 3.

TABLE 3

| Temperature (°C.) | −20 | 0 | 25 | 40 | 60 |
|---|---|---|---|---|---|
| Temp. Charac. (ppm/°C.) of fr | −3.84 | 1.07 | | −2.25 | 2.48 |

As can be seen from Table 3, the piezoelectric resonator unit according to this invention and using a PZT family piezoelectric ceramic resonator can readily attain the temperature characteristic of the resonance frequency within ±5 ppm/°C.

The piezoelectric ceramic resonator unit according to this invention has an aging characteristic of 0.02%/decade which is better than that of the resonator itself. In addition, the temperature coefficient of the resonance frequency of PZT family piezoelectric ceramic can be made smaller than that of lead titanate family piezoelectric ceramic by slightly changing its composition. However, in the cse of a resonator having a reduced temperature coefficient of ±10 ppm/°C. in connection with resonance frequency of the thickness shear mode by changing the composition of NEPEC-31, the aging characteristic of the resonance frequency was deteriorated to 0.06%/decade.

Accordingly, in fabricating a piezoelectric ceramic resonator unit according to the present invention, a composition with a satisfactory aging characteristic but an unsatisfactory temperature coefficient of the resonance frequency can be used, and thus the resonator unit has a satisfactory aging characteristic. The unit structure of this invention provides a superior temperature characteristic for the resonance frequency, and thus satisfactory results can be obtained in both the characteristics.

EXAMPLE 3

A piezoelectric ceramic resonator unit exemplified here consists of a thickness shear mode, trapped energy resonator, as shown in FIG. 1B, made of piezoelectric ceramic material, NEPEC-31, produced by Tohoku Metal Industries, Ltd. and a non-polarized ceramic capacitor made of NEPEC-31. The thickness shear mode resonator made of NEPEC-31 has a resonance frequency frp of 1999.3 kHz, an antiresonance frequency fap of 2250.4 kHz, a capacitance ratio $\gamma_p$ of 3.764, and a mechanical quality factor Qm of 1500. A non-polarized capacitor (tan $\delta$=0.005) made of NEPEC-31 was connected in series to the resonator, and the relationship between the ratio of the non-polarized capacitance of NEPEC-31 to the damped capacitance Co of the thickness shear mode resonator made of NEPEC-31, the resonance frequency fr of the piezoelectric ceramic resonator unit and the Q-value was measured. Table 4 shows the results of measurement.

TABLE 4

Values of fr and Q vs Ca/CO of resonator unit

| Ca/Co | fr (kHz) | Q |
|---|---|---|
| 1.0 | 2128.1 | 520 |
| 2.0 | 2086.4 | 850 |
| 10.0 | 2023.9 | 1170 |
| 20.0 | 2012.5 | 1340 |
| 30.0 | 2007.2 | 1410 |

It can be seen from the measurement results shown in Table 4 that the value of Q falls down to 500 when Ca/Co is at 1. Value 500 of Q is the lower limit for manufacturing a filter having a fractional band width of 1% or less, and if the value of Q is smaller than 500, the filter insertion loss increases sharply. Some resonator units having a Ca/Co of 0.8 were manufactured for the test, and it was found that the value of Q fell to 400. In this region, the sensitivity was too high for adjusting the frequency and it was difficult to adjust the frequency precisely.

In another case where Ca/Co is 30, the value of (fr−frp)/frp becomes approximately 0.004. A normalized frequency rise by 0.004 substantially coincides with the range of the irregularity of the resonance frequency frp in manufacturing piezoelectric ceramic resonators. Therefore, the frequency cannot be adjusted practically when the value of Ca/Co is larger than 30.

A narrow-band filter constructed of the piezoelectric ceramic resonator unit embodying the present invention will be described below.

EXAMPLE 4

Figure 9:
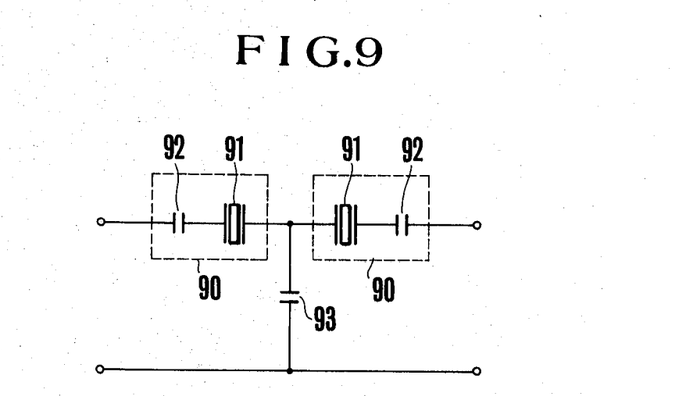
FIG. 9 is a schematic diagram showing a filter constructed by use of the piezoelectric ceramic resonator units in accordance with the present invention.

The filter by use of the piezoelectric ceramic resonator unit of this invention has a frequency range of fo ±5.0 kHz in which the phase shift resides within 90°+30° at a center frequency (fo) of 2000 MHz. FIG. 9 shows a circuit arrangement of the filter. In FIG. 9, reference number 91 denotes a trapped energy thickness shear mode resonator made of NEPEC-31 piezoelectric ceramic and structured as shown in FIG. 1B, and 92 is a non-polarized ceramic capacitor made of NEPEC-21 produced by Tohoku Metal Industries, Ltd. and having a dielectric loss (tan $\delta$) of 0.022. The capacitance of capacitor 92 is ten times as large as the damped capacitance of the resonator 91, and the value of Q of a piezoelectric ceramic resonator unit 90 according to this invention is 950. Reference number 93 denotes an interstage capacitor.

In order to attain the above-mentioned characteristics of the filter, the resonance frequency of the resonator unit must be maintained within ±1 kHz of a design value at the most. In this example, the frequency was adjusted by choosing the cap capacitance of the ceramic capacitor 92 appropriately. The method of frequency adjustment according to this invention merely requires the selection of the externally attached capacitor 92, not only facilitating the frequency adjustment but allowing the minimum error in measuring the resonance frequency because no mechanical distortion is given to the resonator itself.

The temperature coefficient of the center frequency fo of the filter embodying the present invention is ±5 ppm/°C. in the wide temperature range from −20° C. to 60° C., and an aging characteristic for fo of 0.02%/decade can easily be accomplished.

For a filter constructed by a conventional single thickness shear mode resonator 91, it would be very difficult to adjust the frequency with such high accuracy and attain the temperature characteristic and aging characteristic as mentioned above, and these are made feasible practically only by the method of the present invention.

A number of narrow-band filters were manufactured for testing in accordance with the present invention, and all of them satisfied the aforementioned characteristics.

As described above in detail, high performance piezoelectric ceramic filters are realized by employment of the piezoelectric ceramic resonator unit according to this invention, and the present invention should be evaluated from the viewpoint of industry.

Figure 10:
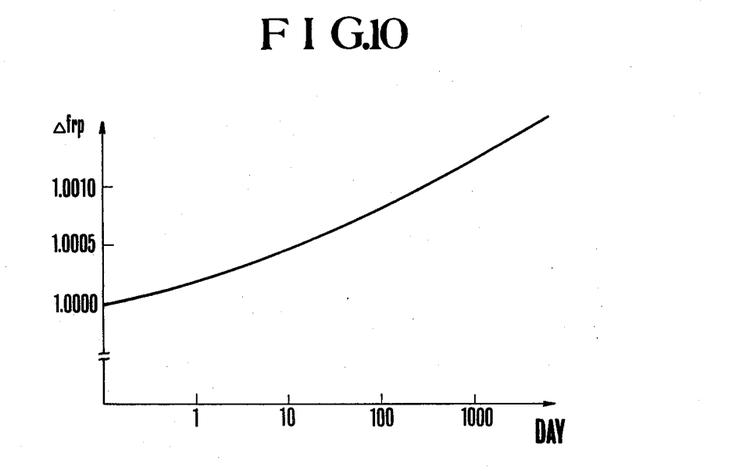
FIG. 10 is a graph showing a normalized aging characteristic of the resonance frequency obtained by a conventional piezoelectric ceramic resonator.

The piezoelectric ceramic resonator starts aging in its resonance frequency frp, antiresonance frequency fap, and damped capacitance Co, immediately after it has been applied with a high voltage for polarization. Generally, the normalized resonance frequency variation Δfrp (Δfrp=frp/frpo, where frpo is the resonance frequency immediately after polarization of the piezoelectric resonator and frp is the resonance frequency during aging) is plotted as shown in FIG. 10. The figure shows that the resonance frequency of the piezoelectric ceramic resonator increases as aging proceeds, providing larger resonance frequency variation as time elapses.

It is known that a general piezoelectric ceramic resonator is forced to age by heat treatment at a temperature of 150° to 200° C. following polarization so as to improve the aging characteristics. However, after the forced aging process, another aging restarts, and the improvement of stability for conventional piezoelectric ceramic resonator was limited to 0.03%/decade whatever high stability material was used.

It can be seen from equation (1) that fr becomes equal to frp when Ca/Co is infinity and also that fr increases and approaches the antiresonance frequency of the piezoelectric ceramic resonator as Ca/Co decreases.

As shown in FIG. 10, the aging characteristic of the resonance frequency frp of the piezoelectric ceramic resonator increases as aging proceeds, and the antiresonance frequency fap in general also increases as aging proceeds, although a few materials provide decreasing aging characteristics.

As can be seen from equation (1), if frp increases as time elapses, fr also increases correspondingly, provided that Ca/Co is kept constant. However, in another embodiment of the present invention, Ca/Co is rendered to increase within the rang of $Co \leq Ca \leq 30Co$ as time elapses so that $fr^2$ approaches $frp^2$ as time elapses. Since fr is always larger than frp, the variation of $fr^2$ by aging is smaller than that of $frp^2$, and thus the aging characteristic of the piezoelectric ceramic resonator unit according to this embodiment is improved.

For example, if the damped capacitance Co of the piezoelectric ceramic resonator has a negative aging characteristic and the antiresonance frequency fap decreases as aging proceeds, the aging characteristic of the resonance frequency fr of the piezoelectric ceramic resonator unit can be improved by merely coupling a capacitor Ca having the same aging characteristic as that of the damped capacitance Co in series to the resonator. The aging characteristic of the resonance frequency fr can further be improved when a capacitor Ca having more flat aging characteristic than that of the damped capacitance Co is coupled directly.

In usually available materials, however, fap of the resonator increases as time elapses.

EXAMPLE 5

Figure 11:
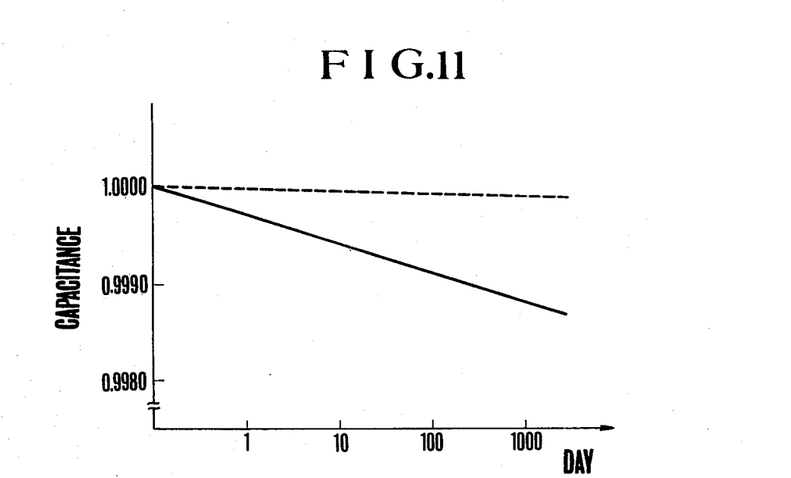
FIG. 11 is a graph showing a normalized aging characteristic of capacitance, where solid line curve shows the aging characteristic of the damped capacitance of a thickness shear mode piezoelectric ceramic resonator and dotted line curve shows the aging characteristic of capacitance of a non-polarized ceramic capacitor connected in series to the piezoelectric ceramic resonator.
Figure 12:
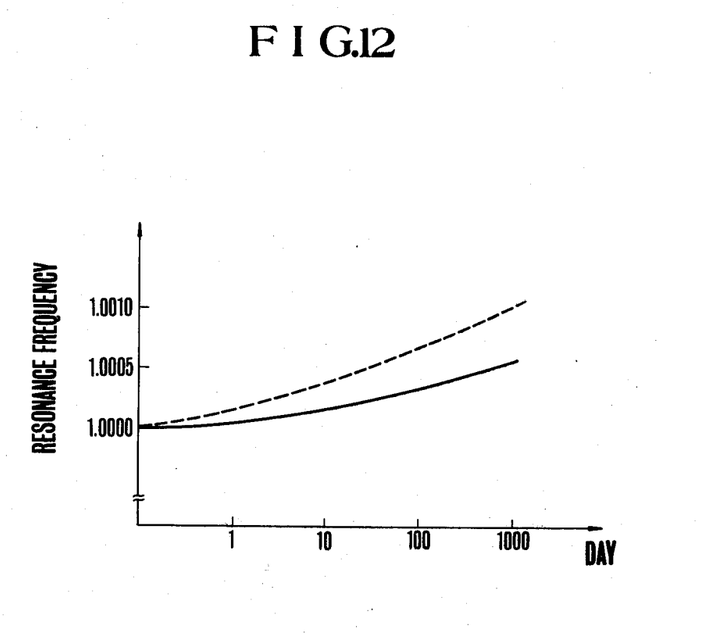
FIG. 12 is a graph showing, with the dotted line curve, the aging characteristic of the resonance frequency of a conventional piezoelectric ceramic resonator and, with solid line curve, that of the piezoelectric ceramic resonator unit in accordance with the present invention.

A trapped energy, thickness shear mode resonator is made of a piezoelectric ceramic material, NEPEC-31 manufactured by Tohoku Metal Industries, Ltd. It has dimensions of 12 mm in length, 0.55 mm in thickness and 0.32 mm in width, and is provided with electrodes of Cr-Au extending in the full width from one end toward the center on both major surfaces with the overlapped electrodes being 2.5 mm. The resonator has a damped capacitance Co of 13.41 pF and the aging characteristic as shown by solid line curve in FIG. 11 (the characteristic curve is normalized to the initial value). An externally attached ceramic capacitor having a capacitance of 40.3 pF is made of non-polarized NEPEC-31, and it has the aging characteristic as shown by dotted line curve in FIG. 11 (the characteristic curve is normalized to the initial value). FIG. 12 shows, at dotted line curve, the aging characteristic of a piezoelectric ceramic resonator which has been subjected to thermal treatment at a temperature of 150° C. (the characteristic curve is normalized to the resonance frequency frpo obtained immediately after the heat treatment). FIG. 12 also shows, at solid line curve, the aging characteristic of the resonance frequency of the piezoelectric ceramic resonator unit of this example employing a piezoelectric resonator which has been subjected to the same thermal treatment as that of resonator represented by the dotted line curve (the solid aging characteristic curve is normalized to the resonance frequency fro).

It can be seen from the above description that even in the piezoelectric ceramic resonator using highly stable NEPEC-31, the aging characteristic of the resonance frequency is at most 0.03%/decade, whereas the piezoelectric resonator unit in accordance with this example is improved to have a characteristic of 0.015%/decade.

EXAMPLE 6

The piezoelectric ceramic resonator unit of this embodiment is applied to a 2 MHz narrow band filter having a percent band width of 0.5%. As shown in FIG. 9, two ceramic resonator units 90 each consists of an NEPEC-31 non-polarized capacitor 92 and a thickness shear mode resonator 91, and an NEPEC-31 non-polarized capacitor as a inter-stage capacitor 93 is provided. As the result, the aging characteristic was considerably improved from 0.03%/decade obtained by employment of the conventional single piezoelectric ceramic resonator to a characteristic of 0.013%/decade. The characteristic of 0.013%/decade could not at all be attained by the conventional piezoelectric ceramic resonator.

In still another embodiment of the invention, it is intended to improve the temperature characteristic of mechanical quality factor Qm under the condition that $Co \leq Ca \leq 30Co$. In regard to a piezoelectric ceramic resonator having a relatively high Qm, it is known that the value of Qm decreases sharply at a high temperature and increases sharply at a low temperature. Qm of the piezoelectric ceramic resonator can be expressed as:

$$Qm = frp/2\pi CoR1(fap^2 - frp^2) \quad (8)$$

where frp signifies the resonance frequency of the piezoelectric ceramic resonator. The damped capacitance Co generally has a temperature coefficient ranging from 1500 to 3000 ppm/°C., and thus even if the temperature rises from 25° C. to 60°, the variation of Co is 10% at most. That is, a large temperature dependent variation of Qm of piezoelectric ceramic resonator is mostly caused by the resonant resistance R1, and when the R1 increases at a high temperature, the Qm decrease, and when the R1 decreases at a low temperature, the Qm increases.

Next, the circuit arrangement where the externally attached ceramic capacitor 15 having a positive temerature coefficient in its dielectric constnat is connected to the piezoelectric ceramic resonator 14, as shown in FIG. 2, will be discussed. The equivalent resistance Ra representing the dielectric loss of the ceramic capacitor 15 is expressed by equation (4), and therefore, if the capacitor is made of a material having a tan δ with less temperature dependent variation, Ra will decreases as the temperature rises, and Ra will increase as the temperature falls.

The principle of this embodiment is that the temperature dependent variation of the equivalent mechanical quality factor is made as small as possible, so that the temperature dependent variation of the filter insertion loss is made small. That is, in order to minimize the temperature dependent variation of Q, an increase of the resonant resistor R1 of the piezoelectric ceramic vibrator at a high temperature and a decrease of R1 at a low temperature are compensated by the equivalent dielectric loss resistance Ra of the ceramic capacitor coupled to the piezoelectric ceramic resonator.

EXAMPLE 7

A thickness shear mode resonator has dimensions of 12 mm in length, 0.552 mm in thickness and 0.32 mm in width. On the top and back surfaces, there are provided electrodes made of Cr-Au extending in the full width from opposite ends toward the center. Both the electrodes partly overlap with each other in a length of 2.5 mm so as to form a trapped energy resonator having the damped capacitance Co of 13.4 pF, the temperature characteristic of +2200 ppm/°C., the resonance frequency frp and antiresonance frequency fap at the room temperature of 1998.4 kHz and 2253.6 kHz, respectively. The mechanical quality factor Qm of the piezoelectric ceramic resonator has the temperature characteristic shown at dotted line curve in FIG. 13.

Figure 13:
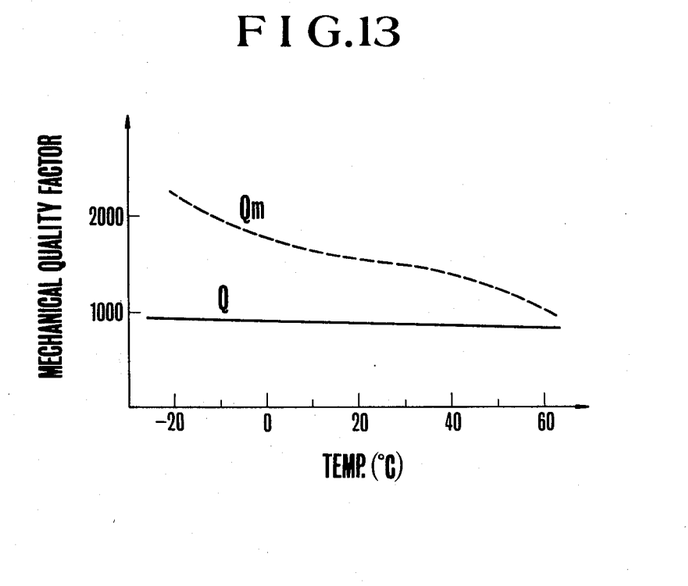
FIG. 13 is a graph showing the temperature dependency of the mechanical quality factor, where dotted line curve shows Qm of a conventional thickness shear mode resonator and solid line curve shows Q of the resonator unit according to the invention.

The graph shows that Qm is 1500 at the room temperature, more than 2000 at −20° C., and it falls to 1000 at 60° C.

Figure 14:
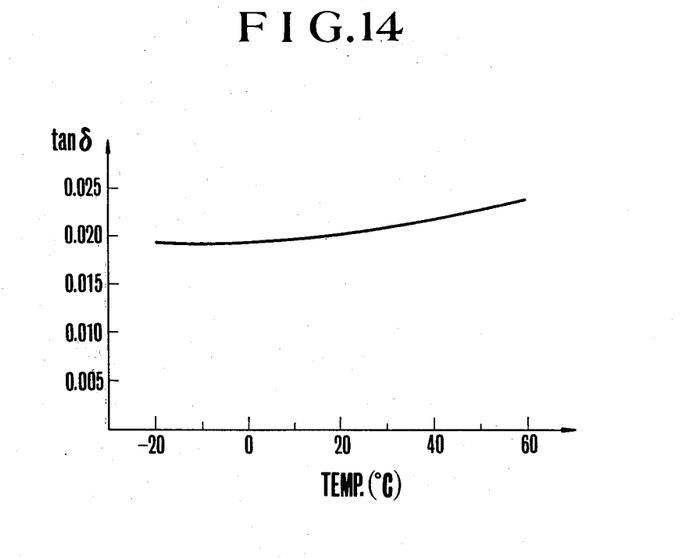
FIG. 14 is a graph showing the temperature dependency of tan δ of a NEPEC-21 (trademark)—Pb[$Zr_{0.5}Ti_{0.47}(Sb_{1/2}Nb_{1/2})_{0.02}$]$O_3$, see U.S. Pat. No. 3,544,471—non-polarized capacitor.

A non-polarized ceramic capacitor made of NEPEC-21 has a capacitance ten times larger than the damped capacitance of the piezoelectric ceramic resonator, and the temperature coefficient of its dielectric constant is +3400 ppm/°C. FIG. 14 shows the temperature dependency of the non-polarized ceramic capacitor made of NEPEC-21, indicating that tan δ only slightly varies depending on the temperature.

The equivalent mechanical quality factor Q of the resonator unit consisting of the NEPEC-31 thickness shear mode resonator coupled with the NEPEC-21 non-polarized ceramic capacitor is shown at solid line curve in FIG. 13. The plot shows that the temperature dependent variation of Q in the case of this example is very small, whereas Qm of the conventional NEPEC-31 thickness shear mode resonator drops sharply as the temperature rises. It has been very difficult to find a single piezoelectric material having a mechanical quality factor of around 1000 and a flat temperature characteristic for Qm. However, the piezoelectric resonator unit of this embodiment achieves such characteristics.

EXAMPLE 8

A filter having resonator units exemplified in Example 7 has an inter-stage capacitor of an NEPEC-31 non-polarized capacitor to form a relatively narrow band filter with the center frequency of 2.048 MHz and the fractional band width of 0.8%. The variation of the insertion loss is within 1.0 db in the temperature range from −20° C. to 60° C.

If the filter were constructed merely using NEPEC-31 thickness shear mode resonators, it would be impossible to achieve the insertion loss variation within 2.0 db in the temperature range from −20° C. to 60° C.

In the foregoing description, the invention has been explained by way of the quadratic ladder-type filter as shown in FIG. 9. The invnetion is also useful for ladder-type filters with much higher degree, and the invention can of course be applied to piezoelectric ceramic filters of the Jaumann type circuit arrangement.

It should be noted that the mechanical quality factor Qm of the thickness shear mode piezoelectric ceramic resonator has the same dependency on temperature as that of the thickness extensional mode resonator and the contour extensional mode resonator of a disk. Therefore, this invention is also useful for piezoelectric ceramic resonators using such vibration modes.

What is claimed is:

1. A piezoelectric ceramic resonator unit comprising a thickness mode piezoelectric ceramic resonator and a ceramic capacitor connected in series with the resonator, wherein a capacitance $C_a$ of said ceramic capacitor and a damped capacitance $C_o$ of said resonator have the following relationship $C_o \leq C_a \leq 30 C_o$, wherein (i) the temperature coefficient of said serially connected ceramic capacitor is different from that of said piezoelectric ceramic resonator; (ii) said ceramic capacitor has an aging characteristic such that the ratio of the capacitance $C_a$ of said ceramic capacitor to the damped capacitance $C_o$ of said piezoelectric ceramic resonator, i.e. $C_a/C_o$, increases as time elapses; and (iii) said ceramic capacitor has a positive temperature coefficient in its dielectric constant and a relatively small temperature dependent variation in its dielectric loss tangent.

2. A piezoelectric ceramic resonator unit according to claim 1 wherein the thickness mode is a thickness shear mode.

3. A piezoelectric ceramic resonator unit according to claim 1 wherein the thickness mode is a thickness extensional mode.

4. A piezoelectric ceramic filter comprising a plurality of piezoelectric ceramic resonator units as recited in claim 1, wherein said resonator units are arranged in a ladder type circuit.

5. A piezoelectric ceramic filter comprising a plurality of piezoelectric ceramic resonator units as recited in claim 1, wherein said resonator units are arranged in a Jaumann type circuit.

6. A piezoelectric ceramic filter comprising a plurality of piezoelectric ceramic resonator units as recited in claim 2 or 3, wherein said resonator units are arranged in a ladder type circuit.

7. A piezoelectric ceramic filter comprising a plurality of piezoelectric ceramic resonator units as recited in claim 2 or 3, wherein said resonator units are arranged in a Jaumann type circuit.

* * * * *